US012227872B2

(12) United States Patent
Takano et al.

(10) Patent No.: US 12,227,872 B2
(45) Date of Patent: Feb. 18, 2025

(54) SINGLE-CRYSTAL PULLING APPARATUS AND SINGLE-CRYSTAL PULLING METHOD

(71) Applicant: SHIN-ETSU HANDOTAI CO., LTD., Tokyo (JP)

(72) Inventors: Kiyotaka Takano, Annaka (JP); Wataru Yajima, Nishigo-mura (JP); Kosei Sugawara, Nishigo-mura (JP); Hiroyuki Kamada, Nishigo-mura (JP); Tomohiko Ohta, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 418 days.

(21) Appl. No.: 17/605,399

(22) PCT Filed: Mar. 19, 2020

(86) PCT No.: PCT/JP2020/012164
§ 371 (c)(1),
(2) Date: May 16, 2022

(87) PCT Pub. No.: WO2020/225985
PCT Pub. Date: Nov. 12, 2020

(65) Prior Publication Data
US 2023/0175166 A1    Jun. 8, 2023

(30) Foreign Application Priority Data

May 8, 2019 (JP) .................................. 2019-088473

(51) Int. Cl.
*C30B 15/20* (2006.01)
*C30B 29/06* (2006.01)
*C30B 30/04* (2006.01)

(52) U.S. Cl.
CPC .............. *C30B 15/20* (2013.01); *C30B 29/06* (2013.01); *C30B 30/04* (2013.01)

(58) Field of Classification Search
CPC ....... C30B 15/20; C30B 15/305; C30B 29/06; C30B 30/04
See application file for complete search history.

(56) References Cited

U.S. PATENT DOCUMENTS 6,535,092 B1 * 3/2003 Hurley ................. H01F 7/0278
335/298
2004/0107894 A1    6/2004 Shimonosono et al.
(Continued)

FOREIGN PATENT DOCUMENTS

CN      108026660 A     5/2018
DE      103 24 674 A1    1/2004
(Continued)

OTHER PUBLICATIONS

"Helmholtz coll" Wikipedia entry: <https://de.wikipedia.org/wiki/Helmholtz-Spule> [Retrieved online Sep. 11, 2023].
(Continued)

*Primary Examiner* — Hua Qi
(74) *Attorney, Agent, or Firm* — Oliff PLC

(57) ABSTRACT

A single-crystal pulling apparatus includes: a pulling furnace having a heater and crucible; and a magnetic field generation device having superconducting coils, the device having four of the superconducting coils, two of the superconducting coils are in each of two regions divided by a cross section that includes an X axis being a direction of magnetic force lines at the central axis in the horizontal plane including all the coil axes of the four superconducting coils, and includes the pulling furnace central axis having line symmetry about the cross section, the four superconducting coils are all arranged so that the coil axes have an angle of more than −30° and less than 30° relative to a Y axis, the direction of the magnetic force lines thereof have line symmetry about the cross section, and in each of the regions, the two (Continued)

superconducting coils generate magnetic force lines in opposite directions.

10 Claims, 8 Drawing Sheets

(56) References Cited

U.S. PATENT DOCUMENTS

| | | |
|---|---|---|
| 2005/0166600 A1 | 8/2005 | Mitsubori |
| 2010/0101485 A1 | 4/2010 | Fu et al. |
| 2014/0053771 A1 | 2/2014 | Walter et al. |
| 2018/0237940 A1* | 8/2018 | Takano ............... C30B 15/14 |

FOREIGN PATENT DOCUMENTS

| | | | |
|---|---|---|---|
| DE | 11 2016 003 796 T5 | 5/2018 | |
| EP | 843028 A1 * | 5/1998 | ........... C30B 15/305 |
| JP | H10-139599 A | 5/1998 | |
| JP | 2000-182823 A | 6/2000 | |
| JP | 2004-51475 A | 2/2004 | |
| JP | 2005-123313 A | 5/2005 | |
| JP | 2017-57127 A | 3/2017 | |
| KR | 10-2010-0045399 A | 5/2010 | |
| KR | 10-2018-0054615 A | 5/2018 | |
| WO | 2017/047008 A1 | 3/2017 | |

OTHER PUBLICATIONS

Sep. 11, 2023 Office Action issued in German Patent Application No. 11 2020 001 801.6.
Nov. 21, 2021 International Preliminary Report on Patentability issued in International Patent Application No. PCT/JP2020/012164.
Jun. 9, 2020 Search Report issued in International Patent Application No. PCT/JP2020/012164.
Feb. 1, 2024 Office Action in Korean Application No. 10-2021-7035490.
May 23, 2024 Office Action issued in Chinese Patent Application No. 202080033333.8, with partial English translation.
Oct. 22, 2024 Office Action issued in Chinese Patent Application No. 202080033333.8.
Oct. 22, 2024 Office Action issued in Korean Patent Application No. 2021-7035490.

* cited by examiner

[FIG. 1]
(a)
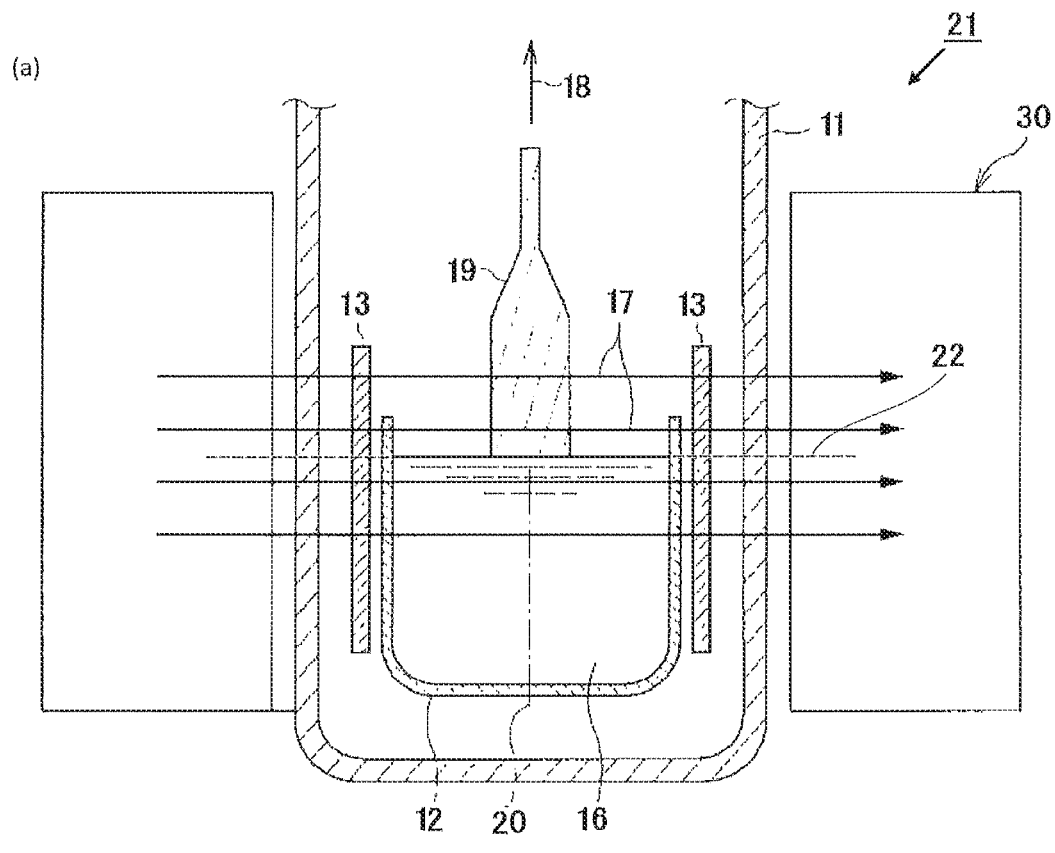
(b)
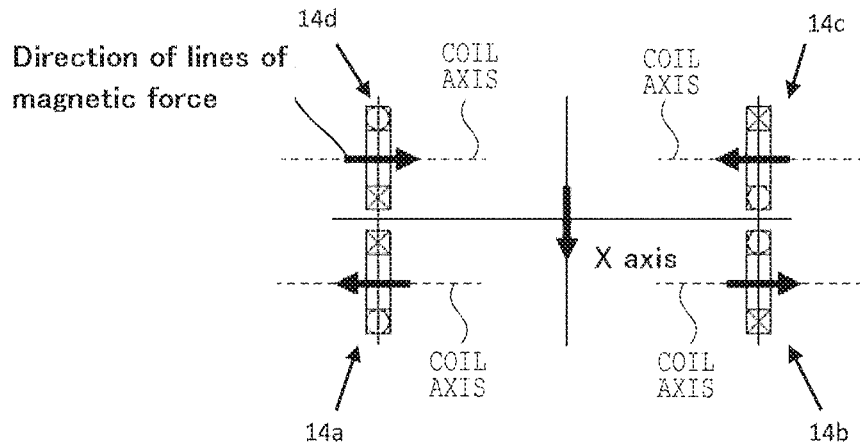

[FIG. 2]
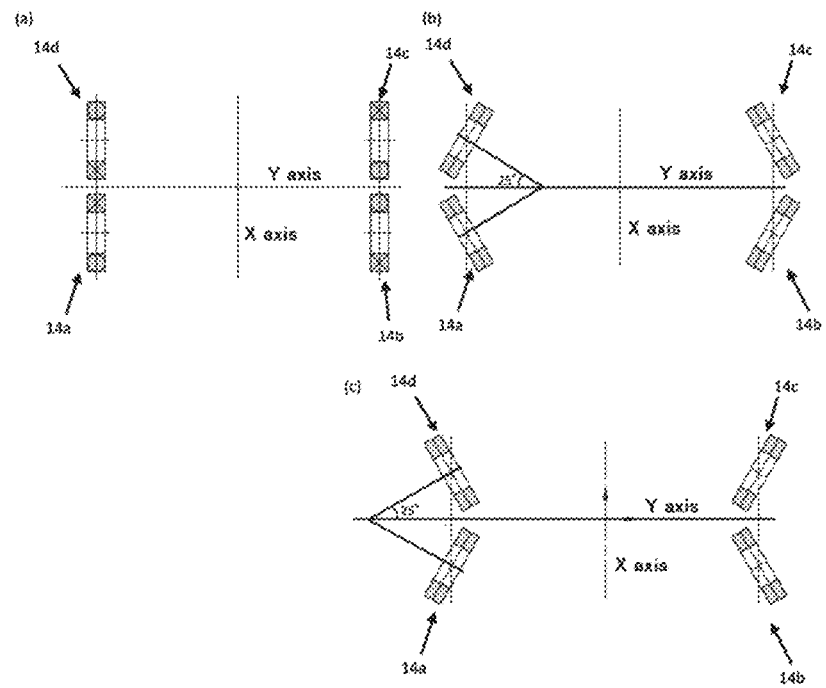
[FIG. 3]
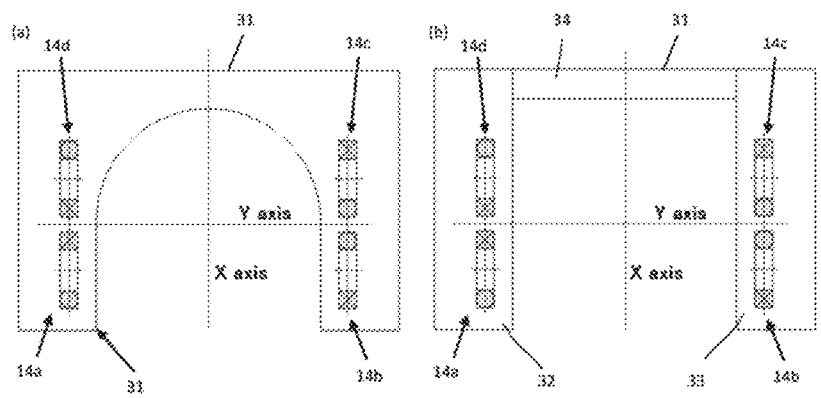
[FIG. 4]
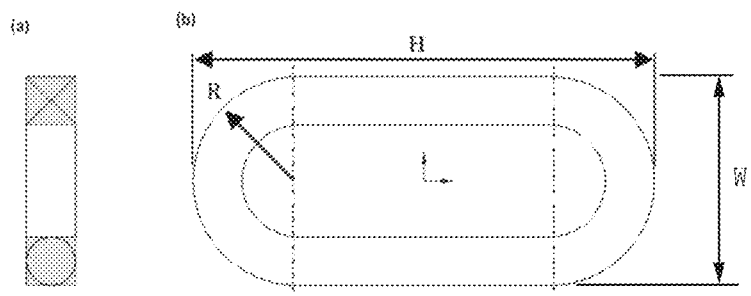

[FIG. 5]
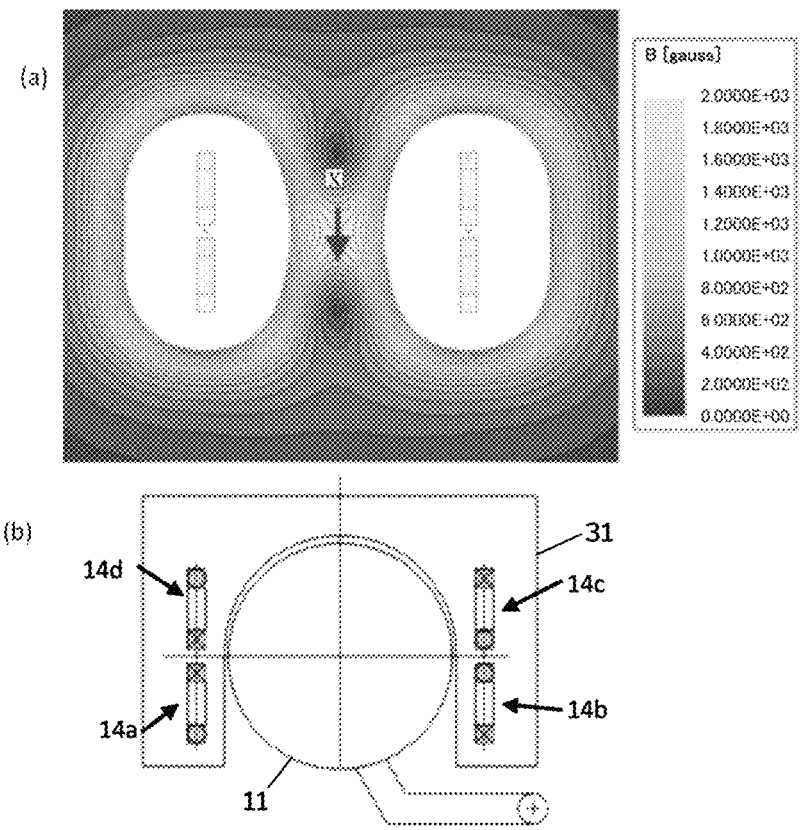
[FIG. 6]
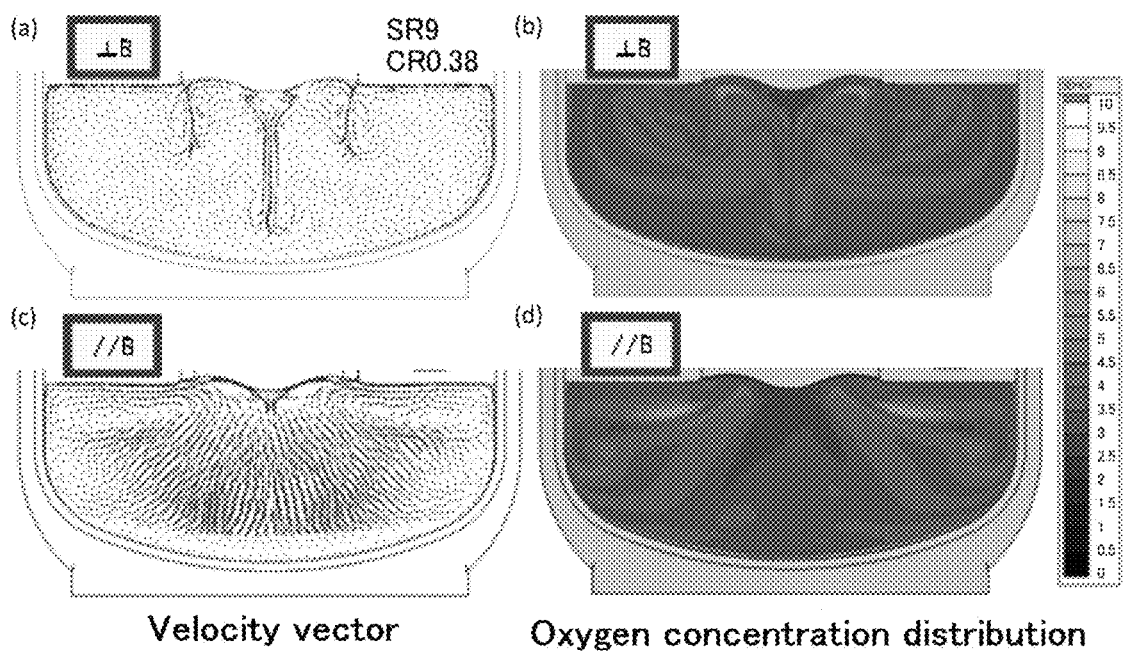
Velocity vector     Oxygen concentration distribution

[FIG. 7]
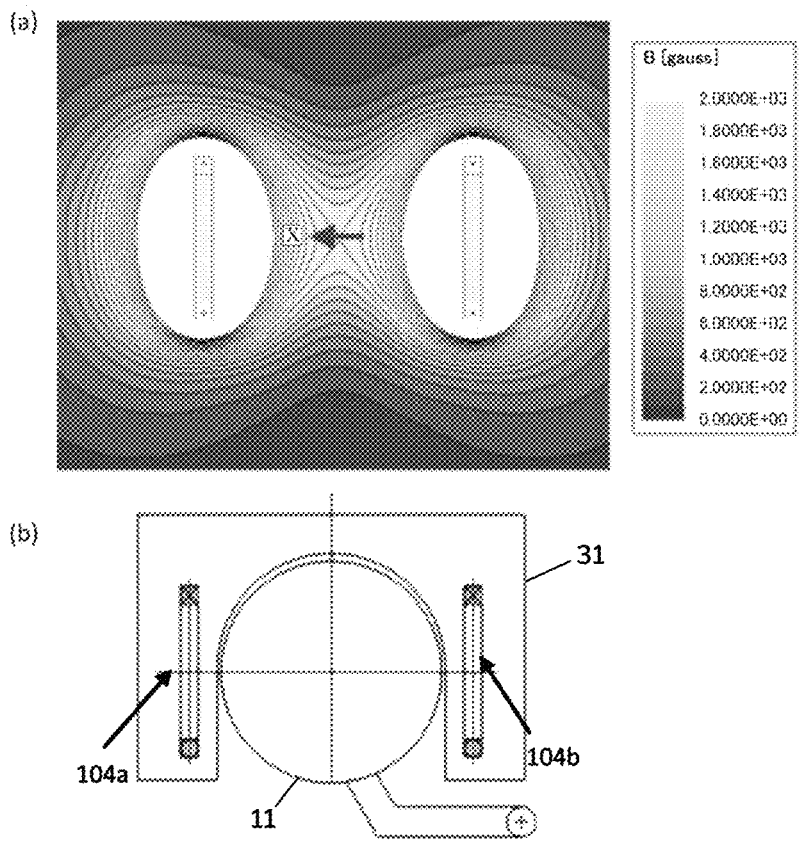
[FIG. 8]
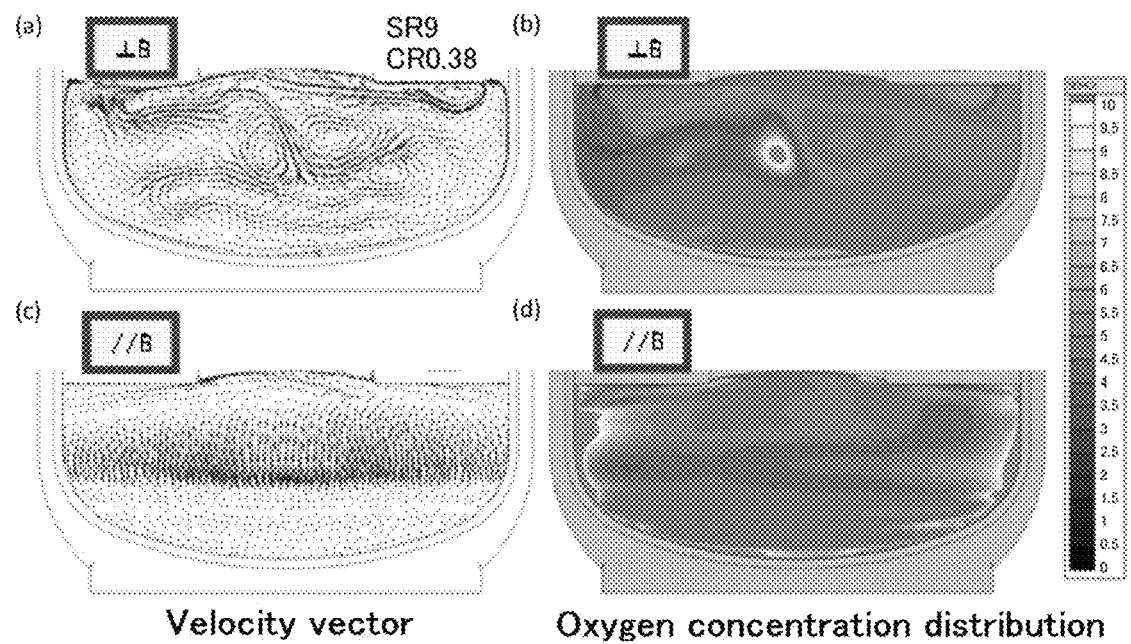
Velocity vector    Oxygen concentration distribution

[FIG. 9]
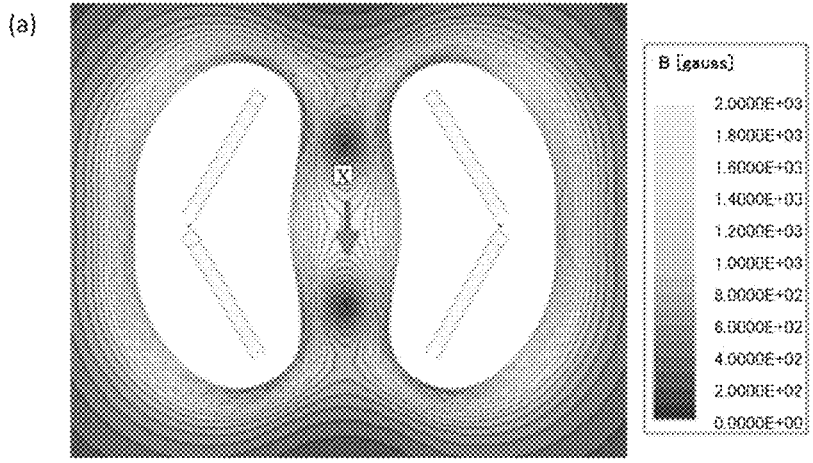
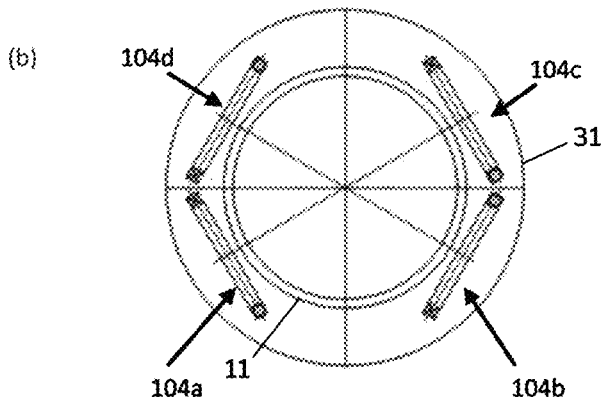
[FIG. 10]
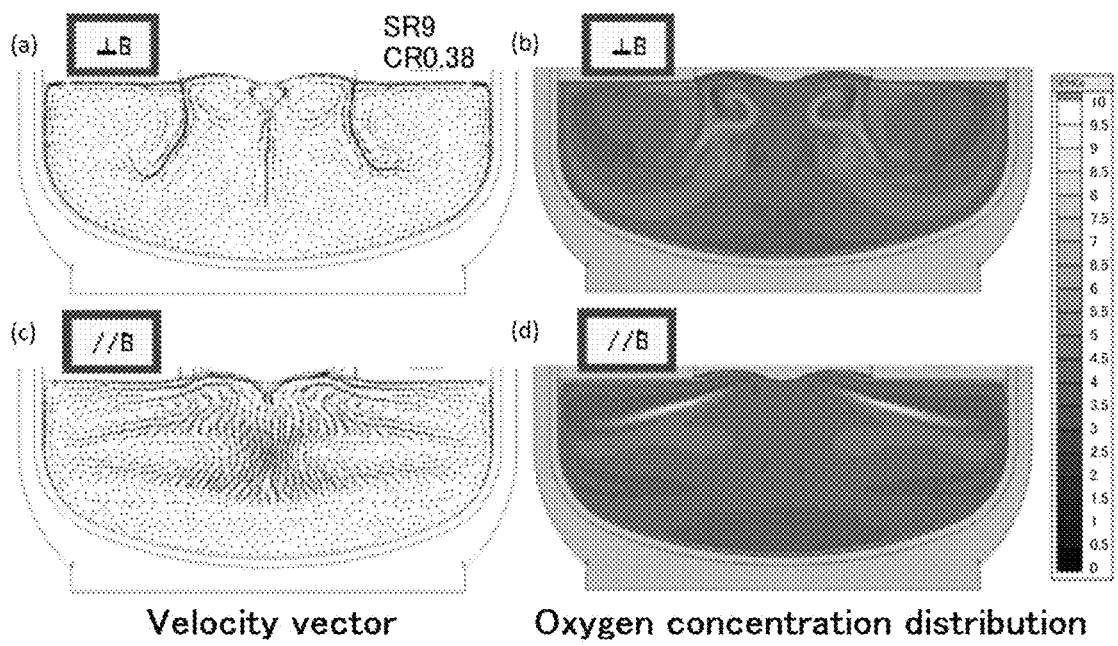

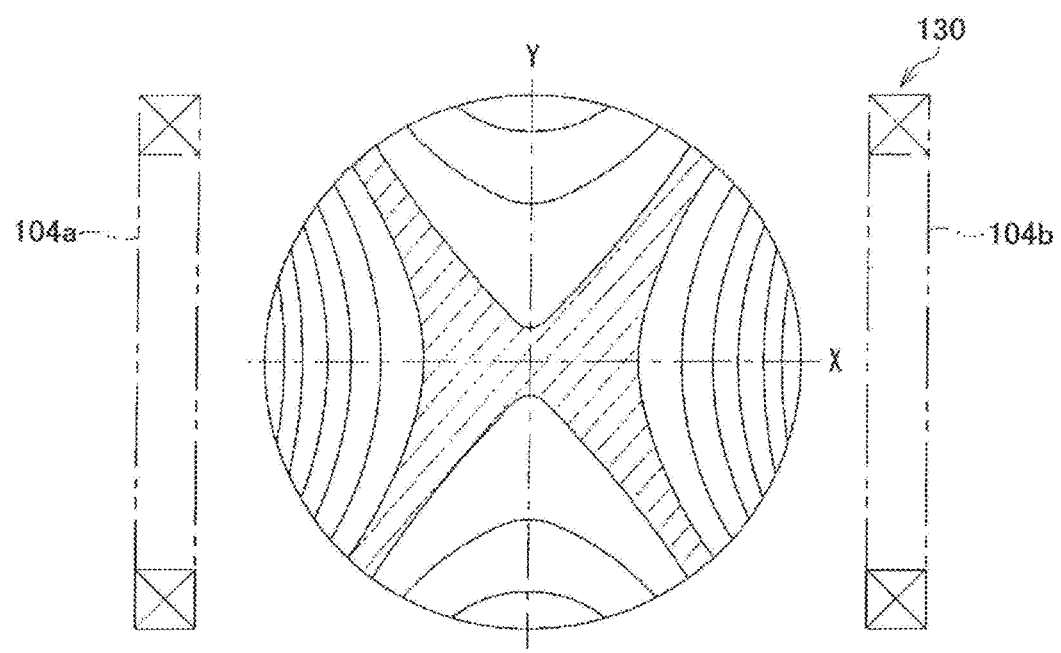
FIG. 13
Prior Art
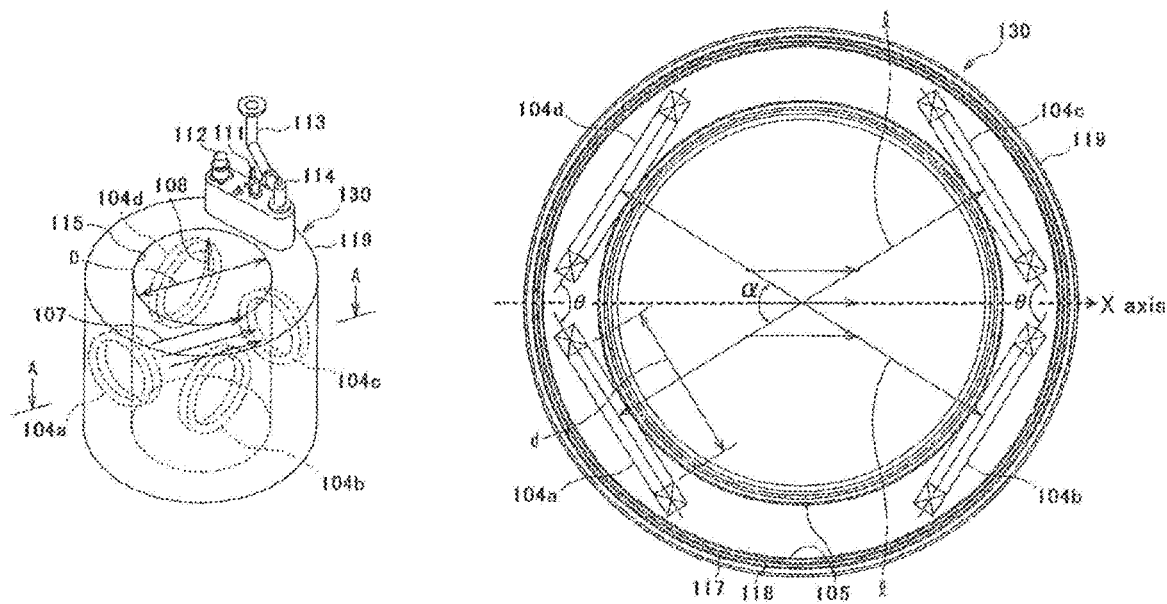
FIG. 14a
Prior Art
FIG. 14b
Prior Art

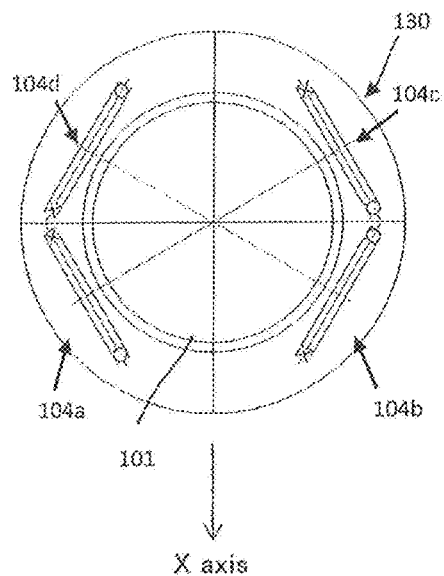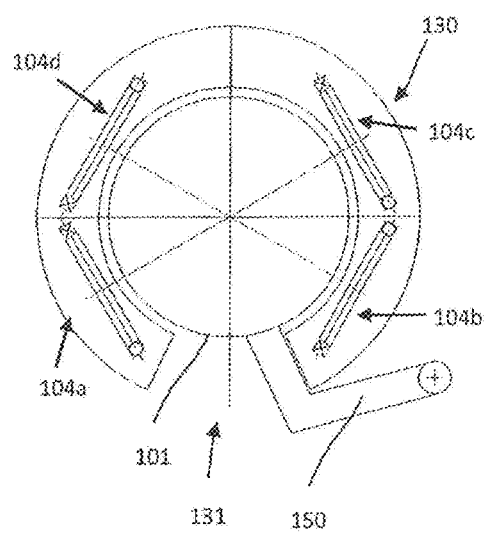
FIG. 15a
Prior Art
FIG. 15b
Prior Art
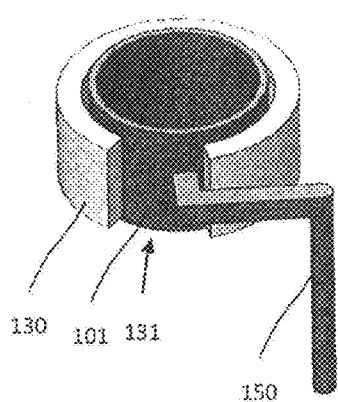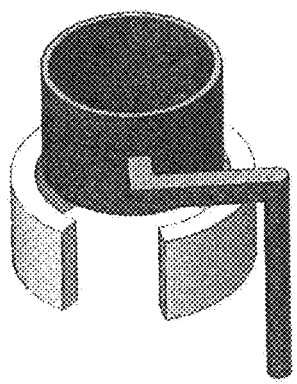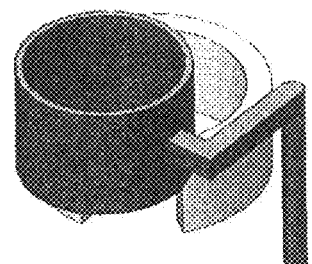
FIG. 16a
Prior Art
FIG. 16b
Prior Art
FIG. 16c
Prior Art

SINGLE-CRYSTAL PULLING APPARATUS AND SINGLE-CRYSTAL PULLING METHOD

TECHNICAL FIELD

The present invention relates to: a single-crystal pulling apparatus; and a single-crystal pulling method using the same.

BACKGROUND ART

Each of semiconductors such as silicon or gallium arsenide is constituted of a single crystal and is used for memories and the like of small to large computers, and an increase in capacity, a reduction in cost, and improvement in quality of memory devices have been demanded.

As one of single-crystal pulling methods for manufacturing single crystals which meet these demands of the semiconductors, there has been conventionally known a method for manufacturing a semiconductor having a large diameter and high quality by applying a magnetic field to a molten semiconductor material (melt) contained in a crucible and thereby inhibiting heat convection produced in a melt (which is generally referred to as a magnetic Czochralski (MCZ) method).

An example of a single-crystal pulling apparatus using the conventional CZ method will now be described with reference to FIG. 11. A single-crystal pulling apparatus 100 in FIG. 11 includes a pulling furnace 101 having an openable/closable upper surface, and includes a crucible 102 in this pulling furnace 101. Further, a heater 103 for heating and melting a semiconductor material in the crucible 102 is provided around the crucible 102 in the pulling furnace 101, and a superconducting magnet 130 having a pair of (two) superconducting coils 104 (104a and 104b) incorporated in a refrigerant container 105 as a cylindrical container (which will be referred to as a cylindrical refrigerant container hereinafter) is arranged on an outer side of the pulling furnace 101.

At the time of manufacturing single crystals, a semiconductor material 106 is put in the crucible 102 and heated by the heater 103 to melt the semiconductor material 106. A non-illustrated seed crystal is moved down and inserted into this melt from above, e.g., a central portion of the crucible 102, and the seed crystal is pulled in a pulling direction 108 at a predetermined velocity by a non-illustrated pulling mechanism. Consequently, a crystal grows in a solid and liquid boundary layer, and a single crystal is produced. At this time, when fluid motion of the melt induced by heating of the heater 103, i.e., the heat convection is produced, a dislocation of the single crystal to be pulled is apt to occur, and a yield rate of single-crystal production is lowered.

Thus, as a countermeasure, the superconducting coils 104 of the superconducting magnet 130 are used. That is, the semiconductor material 106 which is the melt receives motion suppressing power by lines of magnetic force 107 produced by energization to the superconducting coils 104, the growing single crystal is slowly pulled upward with pulling of the seed crystal without producing the convection in the crucible 102, and the single crystal is manufactured as a solid single crystal 109. It is to be noted that, although not shown, the pulling mechanism for pulling the single crystal 109 along a crucible central axis 110 is provided above the pulling furnace 101.

Next, an example of the superconducting magnet 130 used in the single-crystal pulling apparatus 100 shown in FIG. 11 will now be described with reference to FIG. 12. This superconducting magnet 130 has the superconducting coils 104 (104a and 104b) contained in a cylindrical vacuum container 119 through the cylindrical refrigerant container. In this superconducting magnet 130, the pair of superconducting coils 104a and 104b facing each other through a central portion of the vacuum container 119 are accommodated. The pair of superconducting coils 104a and 104b are Helmholtz-type magnetic coils which generate magnetic fields parallel to the same lateral direction, and, as shown in FIG. 11, the lines of magnetic force 107 are generated bisymmetrically to the central axis 110 of the pulling furnace 101 and the vacuum container 119 (a position of this central axis 110 is referred to as a magnetic field center).

It is to be noted that, as shown in FIGS. 11 and 12, this superconducting magnet 130 includes a current lead 111 through which a current is introduced to the two superconducting coils 104a and 104b, a small helium refrigerator 112 for cooling a first radiation shield 117 and a second radiation shield 118 contained in the cylindrical refrigerant container 105, a gas discharge pipe 113 through which a helium gas in the cylindrical refrigerant container 105 is discharged, a service port 114 having a replenishing port from which a liquid helium is replenished, and others. The pulling furnace 101 shown in FIG. 11 is arranged in a bore 115 (the inner diameter of the bore is represented by D) of such a superconducting magnet 130.

FIG. 13 shows a magnetic field distribution of the above-described conventional superconducting magnet 130. As shown in this FIG. 13, in the conventional superconducting magnet 130, a magnetic field gradually increases toward both sides in each coil arranging direction (an X direction in FIG. 13), and the magnetic field gradually decreases toward an up-and-down direction in a direction orthogonal to the former (a Y direction in FIG. 13) since the pair of superconducting coils 104a and 104b facing each other are arranged. In such a conventional configuration, since a magnetic field gradient in the range of the bore 115 is too large as shown in FIGS. 12 and 13, suppression of the heat convection produced in the molten single crystal material (melt) is unbalanced, and magnetic field efficiency is poor. That is, as indicated by hatched lines representing a region having the same magnetic flux density in FIG. 13, magnetic field uniformity is not good in a region near a central magnetic field and its vicinity (i.e., a cross shape which is elongated from right to left and up and down is formed in FIG. 13), and hence there arises a problem that a heat convection suppressing effect is low and a high-quality single crystal cannot be pulled.

A technique for solving the above-described problem is disclosed in Patent Document 1. The technique disclosed in Patent Document 1 will be described with reference to FIG. 14. FIG. 14 (b) shows an A-A cross section of FIG. 14 (a). To solve the problem, as shown in FIG. 14 (a) and FIG. 14 (b), Patent Document 1 discloses that the number of superconducting coils 104 is four or more (e.g., 104a, 104b, 104c, and 104d), these coils are arranged on planes in a cylindrical container concentrically provided around a pulling furnace, the respective arranged superconducting coils are set to directions in which they face each other through an axial center of the cylindrical container, and an arrangement angle θ (see FIG. 14 (b)) at which each pair of superconducting coils adjacent to each other face the inner side of the cylindrical container is set to a range of 100° to 130° (i.e., a center angle α (see FIG. 14 (b)) between axes of coils adjacent to each other with the X axis at the center is 50° to) 80°. Consequently, a lateral magnetic field which has a reduced magnetic field gradient and excellent uniformity can be generated in a bore 115, a magnetic field distribution having a concentric shape or a square shape can be produced on a plane, unbalanced electromagnetic force can be greatly suppressed, thus a uniform magnetic field region in the pulling direction can be improved, a magnetic field in the lateral magnetic field direction becomes substantially horizontal, manufacture of a high-quality single crystal can be realized by suppression of the unbalanced electromagnetic force, and this Patent Document also discloses that a high-quality single crystal can be pulled with a good yield rate by this single-crystal pulling method. Note that in FIG. 14, "d" is the diameter (inner diameter) of the superconducting coils, and "l" is the distance between the pair of coils.

According to this method, the distribution of the magnetic field applied to the molten single crystal material is made uniform, and unbalanced electromagnetic force is suppressed, so that it has become possible to suppress heat convection even with a magnetic flux density lower than that of the conventional technique using two coils.

However, it has been revealed from comprehensive heat transfer analysis including three-dimensional melt convection that there is a difference in heat convection between a cross section parallel to the X axis and a cross section parallel to the Y axis when the lines of magnetic force form a lateral magnetic field that extends in the X axis direction, even in such a uniform magnetic field distribution (see Patent Document 2).

In a case where a conducting fluid moves in a magnetic field, an induced current is produced in a direction orthogonal to lines of magnetic force and a fluid component perpendicular to the lines of magnetic force, but a crucible wall and a free surface of the molten semiconductor material become an insulating wall when a quartz crucible having electrically insulating properties is used. Hence, the induced current does not flow in the direction orthogonal to these members. Thus, convection-suppressing force provided by electromagnetic force is weak in an upper portion of the molten semiconductor material. In addition, comparing the cross section parallel to the X axis (the cross section parallel to the lines of magnetic force) with the cross section perpendicular to the X axis (the cross section perpendicular to the lines of magnetic force), the convection is stronger in the cross section perpendicular to the X axis (the cross section perpendicular to the lines of magnetic force).

As described, when a uniform magnetic field distribution is formed by the four coils, the difference in velocity of the convection is slightly smaller, but there is still a non-uniform flow velocity distribution in a circumferential direction. In particular, since the flow field connecting the crucible wall to a growth interface remains in the cross section perpendicular to the lines of magnetic force, oxygen eluted from the quartz crucible reaches the crystal, and hence there is a problem that an oxygen concentration reducing effect provided by application of a horizontal magnetic field has a limit and a need for extremely low oxygen concentration in semiconductor crystals for power devices or image sensors which have high demand recently is hard to be met. Further, presence of the flow field which is non-uniform in the circumferential direction of the crucible can cause growth striations in the single crystal which is pulled while rotating the same, and a resistivity/oxygen concentration fluctuation in a crystal rotation period is observed when the cross section parallel to a growth direction is evaluated, and hence there is also a problem that a ring-shaped distribution is formed in a wafer plane sliced in a direction perpendicular to the growth direction.

In Patent Document 2, to solve these problems, a magnetic field distribution is generated in such a manner that a magnetic flux density distribution on an X axis is a distribution which is convex upward when a direction of lines of magnetic force at the central axis of a pulling furnace in a horizontal plane including coil axes of the superconducting coils is determined as the X axis, and that a magnetic flux density on the X axis becomes 80% or less of a magnetic flux density set value at a crucible wall, at the same time that a magnetic flux density distribution on a Y axis which is orthogonal to the X axis and runs through the central axis in the horizontal plane is a distribution which is convex downward, and a magnetic flux density on the Y axis becomes 140% or more of the magnetic flux density set value at the crucible wall when the magnetic flux density at the central axis in the horizontal plane is determined as the magnetic flux density set value. In addition, in the magnetic field generation device, two pairs of superconducting coils arranged to face each other are provided in such a manner that respective coil axes thereof are included in the same horizontal plane, and a center angle $\alpha$ having the X axis sandwiched between the coil axes is set to 100 degrees or more and 120 degrees or less. In this manner, the technology disclosed in Patent Document 2 can achieve the following effects. That is, a flow velocity of the molten single crystal material can be reduced even in the cross section perpendicular to the X axis which has insufficient convectional suppressing force provided by electromagnetic force, and a flow velocity of the molten single crystal material in the cross section parallel to the X axis can be balanced with a flow velocity of the molten single crystal material in the cross section perpendicular to the X axis. In addition, when the flow velocity of the molten single crystal material is reduced even in the cross section perpendicular to the X axis, a time required for oxygen eluted from a crucible wall to reach the single crystal is prolonged, and it is possible to provide the single-crystal pulling apparatus which can greatly reduce oxygen concentration which is taken into the single crystal, by increasing an oxygen evaporation amount from a free surface of the molten single crystal material. Furthermore, it is stated that it is possible to provide the single-crystal pulling apparatus which can suppress the growth striations in the single crystal to be grown by balancing the flow velocity of the molten single crystal material in the cross section parallel to the X axis with the flow velocity of the molten single crystal material in the cross section perpendicular to the X axis.

CITATION LIST

Patent Literature

Patent Document 1: JP 2004-51475 A
Patent Document 2: JP 2017-57127 A

SUMMARY OF INVENTION

Technical Problem

However, the present inventors have analyzed the magnetic field distribution with various coil arrangements, and as a result, it has been revealed that the magnetic field distribution disclosed in Patent Document 2 can also be realized with coil arrangements other than those disclosed in Patent Document 2. Moreover, with the coil arrangement disclosed in Patent Document 2, all the superconducting coils are brought as close to the pulling furnace 101 (chamber) as possible in order to raise magnetic field efficiency. Hence, the space between the superconducting coils 104a and 104b or 104c and 104d becomes narrower than the chamber of the pulling furnace 101 and the graphite member therein (see FIG. 15(a)).

In addition, as shown in FIG. 15(b), it is necessary to raise the chamber of the pulling furnace 101 and large graphite member temporarily so as to avoid the superconducting magnet 130 (magnet), and then take out, even if a cutout 131 is provided in a cylindrical container 105 on both sides or one side of the superconducting coils 104a and 104b or 104c and 104d to allow the chamber of the pulling furnace 101 to rise and rotate. Therefore, working efficiency is poor, and since a heavy object is raised to a high place (by using an arm 150, see FIG. 16), the operation takes an effort, and it is also necessary to ensure safety, so that when dismantling and setting up, it is necessary to lower the magnetic field generation device, and then perform the operation.

The present invention has been made in view of the above problems, and an object thereof is to provide a single-crystal pulling apparatus with which there is no need to move the magnetic field generation device when dismantling and setting up the single-crystal pulling apparatus, and the oxygen concentration in the single crystal to be grown can be reduced, and at the same time, growth striations in the single crystal to be grown can be suppressed. Another object of the present invention is to provide a single-crystal pulling method using such a single-crystal pulling apparatus.

Solution to Problem

To achieve the object, the present invention provides a single-crystal pulling apparatus comprising:

a pulling furnace which has a heater and a crucible containing a molten single crystal material arranged therein, and which has a central axis; and a magnetic field generation device which is arranged around the pulling furnace and has superconducting coils and a cryostat incorporating the superconducting coils, the single-crystal pulling apparatus applying a horizontal magnetic field to the molten single crystal material by energization to the superconducting coils to suppress convection of the molten single crystal material in the crucible, wherein the magnetic field generation device has four of the superconducting coils, all coil axes of the four superconducting coils being arranged so as to be included in a single horizontal plane, when a direction of lines of magnetic force at the central axis in the horizontal plane is determined as an X axis, two of the superconducting coils are arranged in each of a first region and a second region divided by a cross section that includes the X axis and the central axis of the pulling furnace, the four superconducting coils are arranged to have line symmetry about the cross section, the four superconducting coils are all arranged so that the coil axes have an angle within a range of more than −30° and less than 30° in the horizontal plane relative to a Y axis, the Y axis being perpendicular to the X axis, the direction of the lines of magnetic force generated by the four superconducting coils have line symmetry about the cross section, and in each of the first region and the second region, the two superconducting coils generate lines of magnetic force in opposite directions.

A single-crystal pulling apparatus including a magnetic field generation device having such an arrangement of superconducting coils can achieve an arrangement of superconducting coils which does not require the magnetic field generation device to be moved when dismantling and setting up the single-crystal pulling apparatus. Furthermore, when the single-crystal pulling apparatus includes a magnetic field generation device having such an arrangement of superconducting coils, a flow velocity of the molten single crystal material can be reduced even in the cross section perpendicular to the X axis which has insufficient convectional suppressing force provided by electromagnetic force, and a flow velocity of the molten single crystal material in the cross section parallel to the X axis can be balanced with a flow velocity of the molten single crystal material in the cross section perpendicular to the X axis. When the flow velocity of the molten single crystal material is reduced even in the cross section perpendicular to the X axis, a time required for oxygen eluted from a crucible wall to reach the single crystal is prolonged, and it is possible to provide the single-crystal pulling apparatus which can greatly reduce oxygen concentration which is taken into the single crystal, by increasing an oxygen evaporation amount from a free surface of the molten single crystal material. Furthermore, it is possible to provide the single-crystal pulling apparatus which can suppress the growth striations in the single crystal to be grown by balancing the flow velocity of the molten single crystal material in the cross section parallel to the X axis with the flow velocity of the molten single crystal material in the cross section perpendicular to the X axis.

Furthermore, in the inventive single-crystal pulling apparatus, the magnetic field generation device preferably comprises, as the cryostat: a U-shaped cryostat incorporating all the four superconducting coils; or a cryostat incorporating two of the superconducting coils in each of the first region and the second region, the two cryostats having a structurally coupled structure.

With such a magnetic field generation device, a space where there is nothing is created in a near side or a far side of the direction of the lines of magnetic force, so that it becomes possible to operate members configuring the pulling furnace without raising and lowering the magnetic field generation device, and an apparatus for raising and lowering also becomes unnecessary.

Furthermore, a height of the superconducting coils in a vertical direction can be greater than a width of the superconducting coils seen from above in a vertical direction.

When the superconducting coils of the magnetic field generation device have such a shape, the magnetic flux density in the central axis of the pulling furnace can be increased in the horizontal plane including the coil axes, even though the width of the coils seen from above is narrow.

In addition, the present invention provides a single-crystal pulling method comprising pulling a silicon single crystal by using any of the above-described single-crystal pulling apparatuses.

According to such a single-crystal pulling method, the concentration of oxygen that is taken in is greatly reduced, and a silicon single crystal having suppressed growth striations can be grown.

Advantageous Effects of Invention

The inventive single-crystal pulling apparatus can achieve an arrangement of superconducting coils which does not require the magnetic field generation device to be moved when dismantling and setting up the single-crystal pulling apparatus. In addition, the inventive single-crystal pulling apparatus can be a single-crystal pulling apparatus that can greatly reduce the concentration of oxygen that is taken into the single crystal, and can also suppress growth striations in a single crystal to be grown. Furthermore, according to the inventive single-crystal pulling method, the concentration of oxygen that is taken in is greatly reduced, and a single crystal with suppressed growth striations can be grown.

BRIEF DESCRIPTION OF DRAWINGS

FIG. 1 is a schematic view showing an example of the inventive single-crystal pulling apparatus, and (a) is a schematic cross-sectional view of the single-crystal pulling apparatus and (b) is a schematic view showing an arrangement of superconducting coils in a superconductivity generation apparatus (a view from above).

FIG. 2 is a schematic view showing examples of coil arrangement in the inventive single-crystal pulling apparatus (a view from above).

FIG. 3 is a schematic view showing examples of cryostats incorporated in a magnetic field generation device in the inventive single-crystal pulling apparatus.

FIG. 4 is a schematic view showing a shape of superconducting coils that can be used in the present invention.

In FIG. 5, (a) is a schematic view showing a result of magnetic field analysis by simulation in Example 1, and (b) is a schematic view showing an arrangement of superconducting coils in Example 1.

FIG. 6 is a diagram showing results of 3D melt convection analysis taking into consideration the magnetic field distribution by simulation in Example 1, and (a) shows a velocity vector of a melt in a cross section perpendicular to the magnetic field, (b) shows an oxygen concentration of the melt in the cross section perpendicular to the magnetic field, (c) shows a velocity vector of the melt in a cross section parallel to the magnetic field, and (d) shows an oxygen concentration of the melt in the cross section parallel to the magnetic field.

In FIG. 7, (a) is a diagram showing a result of magnetic field analysis by simulation in Comparative Example 1, and (b) is a diagram showing an arrangement of superconducting coils in Comparative Example 1.

FIG. 8 is a diagram showing results of 3D melt convection analysis taking into consideration the magnetic field distribution by simulation in Comparative Example 1, and (a) shows a velocity vector of a melt in a cross section perpendicular to the magnetic field, (b) shows an oxygen concentration of the melt in the cross section perpendicular to the magnetic field, (c) shows a velocity vector of the melt in a cross section parallel to the magnetic field, and (d) shows an oxygen concentration of the melt in the cross section parallel to the magnetic field.

In FIG. 9, (a) is a diagram showing a result of magnetic field analysis by simulation in Comparative Example 2, and (b) is a diagram showing an arrangement of superconducting coils in Comparative Example 2.

FIG. 10 is a diagram showing results of 3D melt convection analysis taking into consideration the magnetic field distribution by simulation in Comparative Example 2, and (a) shows a velocity vector of a melt in a cross section perpendicular to the magnetic field, (b) shows an oxygen concentration of the melt in the cross section perpendicular to the magnetic field, (c) shows a velocity vector of the melt in a cross section parallel to the magnetic field, and (d) shows an oxygen concentration of the melt in the cross section parallel to the magnetic field.

FIG. 13 is a diagram showing a conventional magnetic flux density distribution.

FIG. 14 shows a schematic perspective view and a schematic transverse cross-sectional view showing a superconducting magnet of Patent Document 1.

FIG. 15 shows schematic transverse cross-sectional views showing superconducting magnets of Patent Document 2, and (a) shows a case with a cylindrical container, and (b) shows a case with a cutout in a part of a cylindrical container.

FIG. 16 is a schematic view showing a procedure of raising and rotating a pulling furnace (chamber) in a case where a superconducting magnet of Patent Document 2 is used.

DESCRIPTION OF EMBODIMENTS

Figure 11:
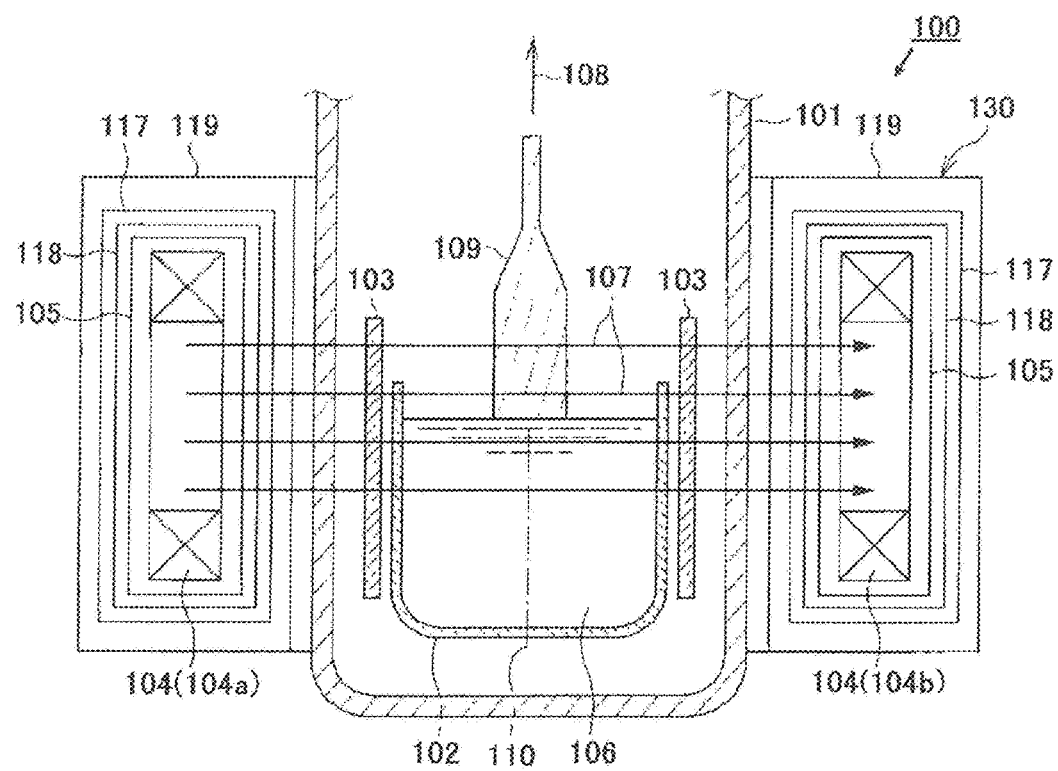
FIG. 11 is a schematic cross-sectional view showing an example of a conventional single-crystal pulling apparatus.
Figure 12:
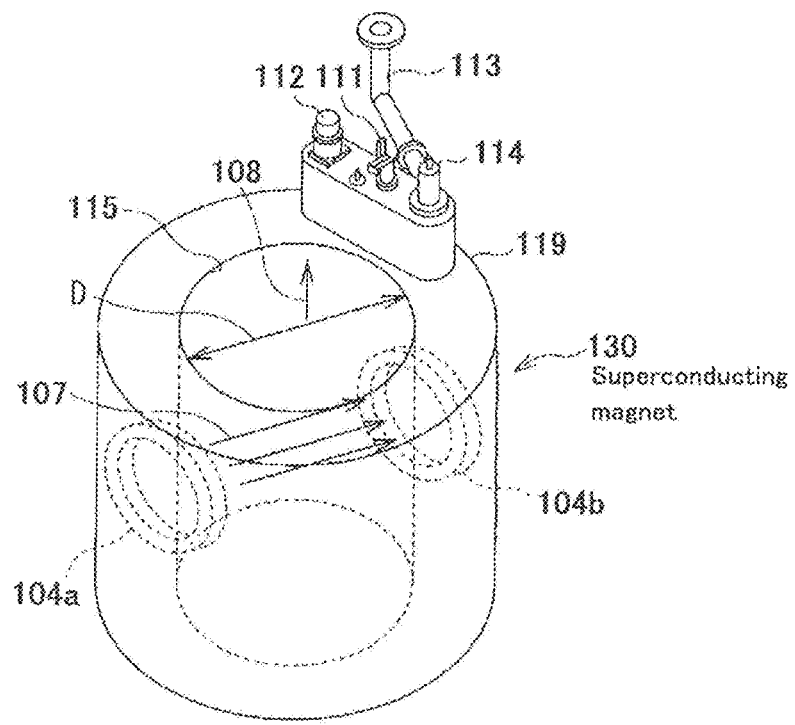
FIG. 12 is a schematic perspective view showing an example of a superconducting magnet in a conventional single-crystal pulling apparatus.

Hereinafter, the present invention will be described in detail as an example of an embodiment with reference to the drawings, but the present invention is not limited thereto.

Firstly, an example of an embodiment of the inventive single-crystal pulling apparatus will be described with reference to FIG. 1. The single-crystal pulling apparatus 21 in FIG. 1(a) includes a pulling furnace 11 in which a heater 13 and a crucible 12 containing a molten single crystal material (hereinafter, also referred to simply as a "melt") 16 are arranged and which has a central axis 20, and a magnetic field generation device 30 which is provided around the pulling furnace 11 and has superconducting coils and a cryostat incorporating the superconducting coils, and the single-crystal pulling apparatus 21 is configured to apply a horizontal magnetic field to the melt 16 by energization to the superconducting coils to suppress convection of the melt 16 in the crucible 12, and in the meantime, pull a single crystal 19 in a pulling direction 18.

Furthermore, the magnetic field generation device 30 has the superconducting coils arranged as shown in FIG. 1(b). As shown in FIG. 1(b), the magnetic field generation device 30 has four superconducting coils. In addition, the coil axes of all the four superconducting coils 14a, 14b, 14c, and 14d are arranged so as to be included in a single horizontal plane (a horizontal plane 22 shown in FIG. 1(a) including the coil axes). Furthermore, when a direction of lines 17 of magnetic force at the central axis 20 in the horizontal plane 22 is determined as an X axis, two of the superconducting coils are arranged in each of a first region and a second region divided by a cross section that includes the X axis and the central axis 20 of the pulling furnace. In FIG. 1(b), when the left side of the X axis on the page is determined as the first region and the right side of the X axis is determined as the second region, the superconducting coils 14a and the superconducting coils 14d are arranged in the first region. The superconducting coils 14b and the superconducting coils 14c are arranged in the second region. In addition, in the present invention, the four superconducting coils 14a, 14b, 14c, and 14d are arranged to have line symmetry about the cross section, as shown in FIG. 1(b). Furthermore, the four superconducting coils 14a, 14b, 14c, and 14d are all arranged so that the coil axes have an angle within a range of more than −30° and less than 30° in the horizontal plane 22 relative to a Y axis, the Y axis being perpendicular to the X axis. FIG. 1(b) shows a state in which the two superconducting coils arranged in each of the first region and the second region are arranged so as to be placed parallel to the X axis. In addition, in the present invention, the direction of the lines of magnetic force generated by the four superconducting coils 14a, 14b, 14c, and 14d have line symmetry about the cross section, as shown in FIG. 1(b). Furthermore, in the present invention, the two superconducting coils generate lines of magnetic force in opposite directions in each of the first region and the second region.

As described above, in the present invention, the four superconducting coils 14a, 14b, 14c, and 14d all need to be arranged so that the coil axes have an angle within a range of more than −30° and less than 30° in the horizontal plane 22 relative to the Y axis, the Y axis being perpendicular to the X axis. FIG. 2 shows an example of a coil arrangement (a view from above) in the inventive single-crystal pulling apparatus. FIG. 2(a) shows a case in which the coil axes are 0° in the horizontal plane 22 relative to the Y axis. In this case, the four superconducting coils 14a, 14b, 14c, and 14d are parallel to the X axis, and the coil axes are parallel to the Y axis. FIG. 2(b) shows a case in which the coil axes are 25° in the horizontal plane 22 relative to the Y axis. Similarly, FIG. 2(c) shows a case in which the coil axes are −25° in the horizontal plane 22 relative to the Y axis. As shown in FIG. 2(c), when the coil axes and the Y axis intersect on the other side of the superconducting coils from the X axis, the angle is defined as a negative angle.

When the coil axes are arranged so as to have an angle within a range of more than −30° and less than 30° relative to the Y axis, a predetermined magnetic field distribution can be generated. With such a magnetic field distribution formed by the arrangement of superconducting coils of the present invention, a flow velocity of the molten single crystal material can be reduced even in the cross section perpendicular to the X axis which conventionally has insufficient convection-suppressing force provided by electromagnetic force, and a flow velocity of the molten single crystal material in the cross section parallel to the X axis can be balanced with a flow velocity of the molten single crystal material in the cross section perpendicular to the X axis. In addition, when the flow velocity of the molten single crystal material is reduced even in the cross section perpendicular to the X axis, a time required for oxygen eluted from a crucible wall to reach the single crystal is prolonged, and it is possible to provide the single-crystal pulling apparatus which can greatly reduce oxygen concentration which is taken into the single crystal, by increasing an oxygen evaporation amount from a free surface of the molten single crystal material. Furthermore, it is possible to provide the single-crystal pulling apparatus which can suppress the growth striations in the single crystal to be grown by balancing the flow velocity of the molten single crystal material in the cross section parallel to the X axis with the flow velocity of the molten single crystal material in the cross section perpendicular to the X axis.

In addition, when the coil axes are arranged so as to have an angle within a range of more than −30° and less than 30° relative to the Y axis, it is possible to achieve an arrangement of superconducting coils which does not require the magnetic field generation device to be moved when dismantling and setting up the single-crystal pulling apparatus. If the coil axes are arranged so as to have an angle within the range −30° or less or 30° or more relative to the Y axis, the width of the cryostat incorporating the superconducting coils becomes large, or the distance between the superconducting coils becomes short, and there is a problem that there arises a need to raise and lower the magnetic field generation device as before, in order to dismantle and set up the graphite component.

The angle of the coil axes is particularly preferably −5° or less relative to the Y axis. With such an angle, the magnetic flux density at the central axis can be maintained even when the number of turns of the superconducting wire or current value is reduced, so that the force applied to the coils can be reduced, and a magnetic field generation device that is not easily quenched can be achieved.

Furthermore, the magnetic field generation device can include, as the cryostat for creating the superconductive state, a U-shaped cryostat 31 incorporating all the four superconducting coils 14a, 14b, 14c, and 14d as shown in FIG. 3(a). Alternatively, the magnetic field generation device can include a cryostat incorporating two of the superconducting coils in each of the first region and the second region, the two cryostats having a structurally coupled structure. An example of a cryostat of this embodiment is shown in FIG. 3(b). In this embodiment, two superconducting coils 14a and 14d are incorporated in a first cryostat 32 in the first region, and two superconducting coils 14b and 14c are incorporated in a second cryostat 33 in the second region. Furthermore, the first cryostat 32 and the second cryostat 33 are structurally coupled with a structural member 34.

With such a magnetic field generation device, a space where there is nothing is created in a near side or a far side of the direction of the lines of magnetic force, so that it becomes possible to rotate a chamber of the pulling furnace 11 or dismantle and set up a graphite component without raising and lowering the magnetic field generation device, and an apparatus for raising and lowering also becomes unnecessary.

Note that regarding the superconducting coils used in the inventive single-crystal pulling apparatus, the height of the superconducting coils in a vertical direction can be greater than a width of the superconducting coils seen from above in a vertical direction. FIGS. 4(a) and (b) show such superconducting coils. FIG. 4(a) shows a cross section of the superconducting coils. FIG. 4(b) shows FIG. 4(a) turned sideways, and the height of the superconducting coils is shown by H. The direction of the H is the up-and-down direction of the vertical direction. In FIG. 4(b), R is the curvature radius of a curved portion (circular arc) of the superconducting coils. When the superconducting coils of the magnetic field generation device have such a shape, the magnetic flux density in the central axis of the pulling furnace can be increased in the horizontal plane including the coil axes, even though the width of the coils seen from above is narrow.

In addition, a silicon single crystal can be pulled by using the inventive single-crystal pulling apparatus. According to such a single-crystal pulling method, the concentration of oxygen that is taken in is greatly reduced, and a silicon single crystal having suppressed growth striations can be grown.

EXAMPLE

Hereinafter, the present invention will be further described on the basis of Examples and Comparative Examples. However, these Examples are merely shown as examples and should not be interpreted to be limiting.

Example 1

Using a magnetic field generation device, magnetic field analysis and 3D melt convection analysis were performed, then a silicon single crystal was pulled by using this device. The magnetic field generation device had two pairs of (four) coils with a radius of 250 mm in upper and lower circular arcs and a height of 1000 mm, and when the direction of lines of magnetic force at the central axis in a horizontal plane including the coil axes of the two pairs of (four) superconducting coils was determined as an X axis, one pair of two superconducting coils was each placed parallel to the X axis on each of the left side and right side (first region and second region) of the cross section including the X axis and the central axis of the pulling furnace, and arranged to have line symmetry about the cross section.

FIG. 5(a) is a result of magnetic field analysis by ANSYS-Maxwell 3D, and was obtained by adjusting the current x number of turns of the coils so that the magnetic flux density at the central axis was 1000 gauss (0.1 tesla) and performing the analysis, and then displaying the distribution of magnetic flux density. Note that FIG. 5(b) is a schematic view showing the arrangement of the four superconducting coils 14a, 14b, 14c, and 14d in this event.

The magnetic flux density of the space including the crystal and melt regions was extracted from the results of the above-described magnetic field analysis, and 3D melt convection analysis was performed taking magnetic field distribution into consideration. FIGS. 6(a) and (c) show the velocity vector in the melt obtained from the results of the analysis (FIG. 6(a) is a cross section perpendicular to the magnetic field, and FIG. 6(c) is a cross section parallel to the magnetic field). Meanwhile, FIGS. 6(b) and (d) show the oxygen concentration distribution in the melt (FIG. 6(b) is a cross section perpendicular to the magnetic field, and FIG. 6(d) is a cross section parallel to the magnetic field).

In this event, calculations were carried out with the calculation conditions: a charge amount of 400 kg; a 32-inch (1 inch is 25.4 mm) crucible; a silicon crystal with a diameter of 306 mm; a crystal rotation of 9 rpm; a crucible rotation of 0.4 rpm; and a pulling rate of 0.4 mm/min.

In the magnetic field of Example 1, convection-suppressing force was also strong in the cross section perpendicular to the lines of magnetic force as in Comparative Example 2 described below, and a comparatively active flow was observed only below the crystal end. In addition, the oxygen concentration in the melt was low.

With this coil arrangement (see FIG. 5(b)), there is no need to raise and lower the magnetic field generation device before dismantling and setting up the graphite component. In addition, a crystal with an extremely low oxygen concentration of under 5 ppma-JEIDA on the entire wafer surface and excellent in in-plane distribution was successfully obtained.

Comparative Example 1

Using a magnetic field generation device having one pair of (two) coils with an outer diameter of 1100 mm arranged bisymmetrically about the central axis of a pulling machine, magnetic field analysis and 3D melt convection analysis were performed, and then a silicon single crystal was pulled by using this device.

FIG. 7(a) is a result of magnetic field analysis by ANSYS-Maxwell 3D, and was obtained by adjusting the current x number of turns of the coils so that the magnetic flux density at the central axis was 1000 gauss (0.1 tesla) and performing the analysis, and then displaying the distribution of magnetic flux density. Note that FIG. 7(b) is a schematic view showing the arrangement of the two superconducting coils 104a and 104b in this event.

The magnetic flux density of the space including the crystal and melt regions was extracted from the results of the magnetic field analysis, and 3D melt convection analysis was performed taking magnetic field distribution into consideration. (a) and (c) of FIG. 8 show the velocity vector in the melt obtained from the results of the analysis (FIG. 8(a) is a cross section perpendicular to the magnetic field, and FIG. 8(c) is a cross section parallel to the magnetic field). Meanwhile, (b) and (d) of FIG. 8 show the oxygen concentration distribution in the melt (FIG. 8(b) is a cross section perpendicular to the magnetic field, and FIG. 8(d) is a cross section parallel to the magnetic field). In the magnetic field of Comparative Example 1, convection-suppressing force was weak in the cross section perpendicular to the lines of magnetic force, and an active vortex flow was created. In addition, the oxygen concentration in the melt was high.

As in Example 1, calculations in this event were carried out with the calculation conditions: a charge amount of 400 kg; a 32-inch (1 inch is 25.4 mm) crucible; a silicon crystal with a diameter of 306 mm; a crystal rotation of 9 rpm; a crucible rotation of 0.4 rpm; and a pulling rate of 0.4 mm/min.

With this coil arrangement (see FIG. 7(b)), there is no need to raise and lower the magnetic field generation device before dismantling and setting up the graphite component. However, it was not possible to obtain a crystal with an extremely low oxygen concentration of under 5 ppma-JEIDA on the entire wafer surface and excellent in in-plane distribution.

Comparative Example 2

Using a magnetic field generation device, magnetic field analysis and 3D melt convection analysis were performed, then a silicon single crystal was pulled by using this device. The magnetic field generation device had, when the direction of lines of magnetic force in the horizontal plane including the coil axes at the central axis of the pulling machine was determined as an X axis, pairs of coils with a diameter of 900 mm arranged to face each other to provide two pairs of (four) coils so that the coil axes were included in the same horizontal plane. In addition, the coils were arranged in a cylindrical container with the angle α between the coil axes sandwiching the X axis as 120 degrees.

FIG. 9(a) is a result of magnetic field analysis by ANSYS-Maxwell 3D, and was obtained by adjusting the current× number of turns of the coils so that the magnetic flux density at the central axis was 1000 gauss (0.1 tesla) and performing the analysis, and then displaying the distribution of magnetic flux density. Note that FIG. 9(b) is a schematic view showing the arrangement of the four superconducting coils 104a, 104b, 104c, and 104d in this event.

The magnetic flux density of the space including the crystal and melt regions was extracted from the results of the magnetic field analysis, and 3D melt convection analysis was performed taking magnetic field distribution into consideration. FIGS. 10(a) and (c) show the velocity vector in the melt obtained from the results of the analysis (FIG. 10(a) is a cross section perpendicular to the magnetic field, and FIG. 10(c) is a cross section parallel to the magnetic field). Meanwhile, FIGS. 10(b) and (d) show the oxygen concentration distribution in the melt (FIG. 10(b) is a cross section perpendicular to the magnetic field, and FIG. 10(d) is a cross section parallel to the magnetic field).

In the magnetic field of Comparative Example 2, convection-suppressing force was also strong in the cross section perpendicular to the lines of magnetic force, and a comparatively active flow was observed only below the crystal end. In addition, the oxygen concentration in the melt was low.

As in Example 1 and Comparative Example 1, calculations in this event were carried out with the calculation conditions: a charge amount of 400 kg; a 32-inch (1 inch is 25.4 mm) crucible; a silicon crystal with a diameter of 306 mm; a crystal rotation of 9 rpm; a crucible rotation of 0.4 rpm; and a pulling rate of 0.4 mm/min.

With this coil arrangement (see FIG. 9(b)), it is possible to obtain a crystal with an extremely low oxygen concentration of under 5 ppma-JEIDA on the entire surface and excellent in in-plane distribution. However, it is necessary to raise and lower the magnetic field generation device before dismantling and setting up the graphite component.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A single-crystal pulling apparatus comprising:
   a pulling furnace which has a heater and a crucible containing a molten single crystal material arranged therein, and which has a central axis; and
   a magnetic field generation device which is arranged around the pulling furnace and has superconducting coils and a cryostat incorporating the superconducting coils,
   the single-crystal pulling apparatus applying a horizontal magnetic field to the molten single crystal material by energization to the superconducting coils to suppress convection of the molten single crystal material in the crucible,
   wherein the magnetic field generation device has four of the superconducting coils, all coil axes of the four superconducting coils being arranged so as to be included in a single horizontal plane,
   when a direction of lines of magnetic force at the central axis in the horizontal plane is determined as an X axis, two of the superconducting coils are arranged in each of a first region and a second region divided by a cross section that includes the X axis and the central axis of the pulling furnace,
   the four superconducting coils are arranged to have line symmetry about the cross section,
   the four superconducting coils are all arranged so that the coil axes have an angle within a range of more than −30° and less than 30° in the horizontal plane relative to a Y axis, the Y axis being perpendicular to the X axis,
   the direction of the lines of magnetic force generated by the four superconducting coils have line symmetry about the cross section, and
   in each of the first region and the second region, the two superconducting coils generate lines of magnetic force in opposite directions.

2. The single-crystal pulling apparatus according to claim 1, wherein the magnetic field generation device comprises a U-shaped cryostat incorporating all the four superconducting coils.

3. The single-crystal pulling apparatus according to claim 2, wherein when viewed in a direction perpendicular to the central axis, a height of the superconducting coils is greater than a width of the superconducting coils.

4. A single-crystal pulling method using the single-crystal pulling apparatus according to claim 3 comprising:
   heating and melting a semiconductor material in the crucible;
   inserting a seed crystal into the melt; and
   pulling a silicon single crystal from the melt.

5. A single-crystal pulling method using the single-crystal pulling apparatus according to claim 2 comprising:
   heating and melting a semiconductor material in the crucible;
   inserting a seed crystal into the melt; and
   pulling a silicon single crystal from the melt.

6. The single-crystal pulling apparatus according to claim 1, wherein when viewed in a direction perpendicular to the central axis, a height of the superconducting coils is greater than a width of the superconducting coils.

7. A single-crystal pulling method using the single-crystal pulling apparatus according to claim 6 comprising:
   heating and melting a semiconductor material in the crucible;
   inserting a seed crystal into the melt; and
   pulling a silicon single crystal from the melt.

8. A single-crystal pulling method using the single-crystal pulling apparatus according to claim 1 comprising:
   heating and melting a semiconductor material in the crucible;
   inserting a seed crystal into the melt; and
   pulling a silicon single crystal from the melt.

9. The single-crystal pulling apparatus according to claim 1, wherein the magnetic field generation device comprises two cryostats having a structurally coupled structure, and incorporating two of the superconducting coils in each of a first region and a second region of the two cryostats.

10. A single-crystal pulling method using the single-crystal pulling apparatus according to claim 9 comprising:
    heating and melting a semiconductor material in the crucible;
    inserting a seed crystal into the melt; and
    pulling a silicon single crystal from the melt.

* * * * *